US007221037B2

(12) United States Patent
Kitaoka et al.

(10) Patent No.: US 7,221,037 B2
(45) Date of Patent: May 22, 2007

(54) METHOD OF MANUFACTURING GROUP III NITRIDE SUBSTRATE AND SEMICONDUCTOR DEVICE

(75) Inventors: Yasuo Kitaoka, Osaka (JP); Hisashi Minemoto, Osaka (JP); Isao Kidoguchi, Hyogo (JP); Akihiko Ishibashi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 198 days.

(21) Appl. No.: 10/757,864

(22) Filed: Jan. 15, 2004

(65) Prior Publication Data
US 2004/0144300 A1    Jul. 29, 2004

(30) Foreign Application Priority Data
Jan. 20, 2003    (JP)    ............................. 2003-011570

(51) Int. Cl.
*H01L 29/12*    (2006.01)
(52) U.S. Cl. ...................... 257/615; 257/607; 257/609; 257/611; 117/54; 117/63; 117/902; 117/952
(58) Field of Classification Search ................ 257/615, 257/607, 609, 611; 117/54, 63, 902, 952
See application file for complete search history.

(56) References Cited

U.S. PATENT DOCUMENTS 5,868,837 A    2/1999    DiSalvo et al.

6,121,121 A    9/2000    Koide (Continued)

FOREIGN PATENT DOCUMENTS

JP    11-145516    5/1999

(Continued)

OTHER PUBLICATIONS

T. Kozawa et al., "Raman scattering from LO phonon-plasmon coupled modes in gallium nitride", Journal of Applied Physics 75(2), Jan. 15, 1994, pp. 1098-1101.

(Continued)

*Primary Examiner*—Yogendra N. Gupta
*Assistant Examiner*—Matthew J. Song
(74) *Attorney, Agent, or Firm*—Hamre, Schumann, Mueller & Larson P.C.

(57) ABSTRACT

The present invention provides a method of manufacturing a Group III nitride substrate that has less variations in in-plane carrier concentration and includes crystals grown at a high growth rate. The manufacturing method of the present invention includes: (i) forming a semiconductor layer (a seed layer 12) on a substrate, with the semiconductor layer being formed of a semiconductor expressed by a composition formula of $Al_uGa_vIn_{1-u-v}N$ (wherein $0 \leq u \leq 1$ and $0 \leq v \leq 1$) and having a (0001) plane present at its surface; (ii) processing the surface of the semiconductor layer so that the surface becomes a plane sloped with respect to the (0001) plane of the semiconductor layer; and (iii) bringing the surface of the semiconductor layer into contact with a melt containing a solvent and at least one Group III element selected from gallium, aluminum, and indium, in an atmosphere containing nitrogen, to make the at least one Group III element and the nitrogen react with each other to grow Group III nitride crystals (GaN single crystals 13) on the semiconductor layer.

7 Claims, 9 Drawing Sheets

U.S. PATENT DOCUMENTS

| | | |
|---|---|---|
| 6,252,255 B1 * | 6/2001 | Ueta et al. .................... 257/94 |
| 6,270,569 B1 | 8/2001 | Shibata et al. |
| 6,447,604 B1 * | 9/2002 | Flynn et al. ................. 117/89 |
| 6,503,610 B2 | 1/2003 | Hiramatsu et al. |
| 6,592,663 B1 | 7/2003 | Sarayama et al. |
| 6,614,059 B1 | 9/2003 | Tsujimura et al. |
| 6,667,252 B2 | 12/2003 | Miyajima et al. |
| 2003/0042496 A1 | 3/2003 | Sasaoka |
| 2004/0124434 A1 | 7/2004 | D'Evelyn et al. |
| 2004/0147096 A1 | 7/2004 | Kitaoka et al. |
| 2004/0183090 A1 | 9/2004 | Kitaoka et al. |
| 2004/0262630 A1 | 12/2004 | Kitaoka et al. |
| 2005/0011432 A1 | 1/2005 | Kitaoka et al. |
| 2005/0082564 A1 | 4/2005 | Kitaoka et al. |
| 2006/0051942 A1 | 3/2006 | Sasaki et al. |

FOREIGN PATENT DOCUMENTS

| | | |
|---|---|---|
| JP | 2000-357663 | 12/2000 |
| JP | 2002-293696 | 10/2002 |
| JP | 3409576 | 3/2003 |
| WO | 2004/013385 | 2/2004 |

OTHER PUBLICATIONS

Kawamura et al., "Growth of a Large GaN single Crystal Using the Liquid Phase Epitaxy (LPE) Technique" Japanese Journal of Applied Physics vol. 42 (2003) pp. L4-L6.

* cited by examiner

METHOD OF MANUFACTURING GROUP III NITRIDE SUBSTRATE AND SEMICONDUCTOR DEVICE

BACKGROUND OF THE INVENTION

1. Field of the Invention

The present invention relates generally to a Group III nitride substrate (a substrate containing Group III nitride crystals), a method of manufacturing the same, and a semiconductor device.

2. Related Background Art

A Group III nitride compound semiconductor such as, for instance, gallium nitride (GaN) (hereinafter also referred to as a "Group III nitride semiconductor" or a "GaN-based semiconductor") has been gaining attention as a material for semiconductor elements that emit blue or ultraviolet light. A blue laser diode (LD) is used for high-density optical disk devices or displays while a blue light emitting diode (LED) is used for displays, lighting, etc. It is expected to use an ultraviolet LD in the field of biotechnology or the like and to use an ultraviolet LED as an ultraviolet source for a fluorescent lamp.

Generally, substrates of a Group III nitride semiconductor (for example, GaN) that are used for LDs or LEDs are formed through vapor phase epitaxy. For instance, substrates have been used that are obtained through heteroepitaxial growth of Group III nitride crystals on a sapphire substrate. However, the sapphire substrate and GaN crystals are different from each other in lattice constant by 13.8% and in coefficient of linear expansion by 25.8%. Hence, a sufficiently high crystallinity cannot be obtained in the GaN thin film obtained through the vapor phase epitaxy. Generally, crystals obtained by this method have a dislocation density of $10^8$ cm$^{-2}$ to $10^9$ cm$^{-2}$ and thus the reduction in dislocation density has been an important issue. In order to resolve this issue, efforts have been made to reduce the dislocation density and thereby, for example, an epitaxial lateral overgrowth (ELOG) method has been developed. With this method, the dislocation density can be reduced to around $10^5$ cm$^{-2}$ to $10^6$ cm$^{-2}$, but its manufacturing process is complicated.

On the other hand, besides the vapor phase epitaxy, a method of carrying out crystal growth from the liquid phase also has been studied. However, since the equilibrium vapor pressure of nitrogen is at least 10000 atm at a melting point of a Group III nitride single crystal such as, for instance, GaN or AlN, conventionally it has been understood that a condition of 8000 atm at 1200° C. is required for growing GaN from liquid phase. In this connection, recently, it was made clear that GaN was able to be synthesized at relatively low temperature and pressure, specifically, 750° C. and 50 atm, by using a Na flux.

Recently, single crystals with the maximum crystal size of about 1.2 mm are obtained by a method in which a mixture of Ga and Na is melted in a nitrogen gas atmosphere containing ammonia at 800° C. and 50 atm, and then the single crystals are grown for 96 hours using the melt (for instance, JP2002-293696A).

Furthermore, another method also has been reported in which after a GaN crystal layer is formed on a sapphire substrate by a metal organic chemical vapor deposition (MOCVD) method, single crystals are grown by a liquid phase epitaxy (LPE) method.

However, in order to manufacture semiconductor devices with excellent characteristics at low cost, it has been required to provide a method of manufacturing a Group III nitride substrate with a lower dislocation density than that of conventional one and a method of manufacturing a Group III nitride substrate at lower cost. A method of growing nitride crystals from liquid phase is expected to be a method that allows a Group III nitride substrate with less defects to be obtained. However, considerable variations in crystallinity are caused depending on a seed crystal to be used and on in-plane carrier concentration of the nitride substrate. Furthermore, the growth rate is not so high, which has been a problem.

SUMMARY OF THE INVENTION

With such a situation in mind, the present invention is intended to provide a Group III nitride substrate that has less variations in in-plane carrier concentration and includes Group III nitride crystals grown at a high growth rate, and to a method of manufacturing the same.

In order to achieve the aforementioned object, a Group III nitride substrate of the present invention includes: a substrate; a semiconductor layer formed on the substrate; and Group III nitride crystals formed on the semiconductor layer, wherein the semiconductor layer is formed of a semiconductor expressed by a composition formula of $Al_uGa_vIn_{1-u-v}N$ (wherein $0 \leq u \leq 1$ and $0 \leq v \leq 1$). A surface of the semiconductor layer is a plane that is sloped in one direction and includes steps of (0001) planes arranged step-wise. The plane sloped in one direction and the (0001) planes form an angle of at least 0.05° therebetween, and the Group III nitride crystals formed on the semiconductor layer have variations in in-plane carrier concentration that are within a range of one fifth to five times a carrier concentration mean value.

In the present invention, the "Group III nitride" denotes a semiconductor expressed by a composition formula of $Al_xGa_yIn_{1-x-y}N$ (wherein $0 \leq x \leq 1$ and $0 \leq y \leq 1$) unless otherwise specified. In this connection, it is understood that a formula of $0 \leq 1-x-y \leq 1$ is satisfied since the composition ratio can never be a negative value (the same applies to other composition formulae).

A manufacturing method of the present invention includes the steps of: (i) forming a semiconductor layer on a substrate, with the semiconductor layer being formed of a semiconductor expressed by a composition formula of $Al_uGa_vIn_{1-u-v}N$ (wherein $0 \leq u \leq 1$ and $0 \leq v \leq 1$) and having a (0001) plane present at its surface; (ii) processing the surface of the semiconductor layer so that the surface becomes a plane sloped with respect to the (0001) plane of the semiconductor layer; and (iii) bringing the surface of the semiconductor layer into contact with a melt containing a solvent and at least one Group III element selected from gallium, aluminum, and indium, in an atmosphere containing nitrogen, to make the at least one Group III element and the nitrogen react with each other to grow Group III nitride crystals on the semiconductor layer.

A semiconductor device of the present invention includes: a substrate; and a semiconductor element formed on the substrate, wherein the substrate is a Group III nitride substrate manufactured by the above-mentioned manufacturing method of the present invention. The semiconductor element may be a laser diode or a light emitting diode.

The Group III nitride substrate of the present invention has less variations in carrier concentration, includes Group III nitride crystals grown at a high growth rate, and thus can be manufactured efficiently.

DETAILED DESCRIPTION OF THE INVENTION

Figure 1A:
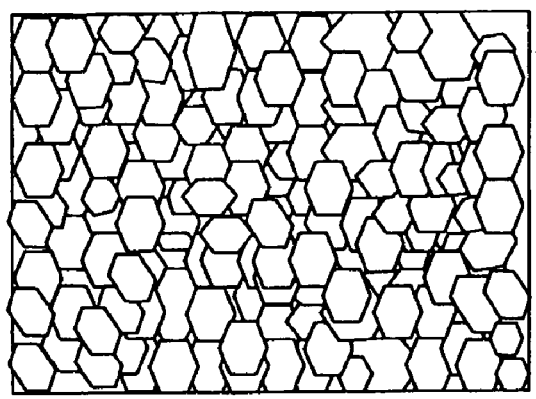
FIGS. 1A (surface) and 1B(cross section) show conventional crystal growth.

In the present invention, it is preferable that the variations in in-plane carrier concentration are as small as possible. However, the variations are at least within a range of one fifth to five times the carrier concentration mean value. The variations in in-plane carrier concentration can be determined by, for example the following method that is described in J. Appl. Phys. 75(2), 15 Jan. 1994, pp. 1098–1101.

(1) First, the relationship between the carrier concentration and Raman spectrum is determined and then a regression formula or a calibration curve is prepared. The regression formula or calibration curve can be prepared based on the relationship between the carrier concentration of a Group III nitride substrate that has been subjected to hole measurement beforehand and its Raman spectrum.

(2) Next, the mean value of the carrier concentrations of the Group III nitride crystals is determined. Specifically, first of all, beams of exciting light used in the Raman measurement are focused to have a beam diameter of 10 to 100 μm and the Raman spectrum is measured at 10 to 50 spots located at 1-mm intervals. Subsequently, based on the Raman spectrum thus measured, the carrier concentrations of the Group III nitride crystals are determined using the regression formula or calibration curve and then the average value thereof is determined.

(3) Furthermore, the Raman spectrum is measured at an arbitrary spot of the Group III nitride crystals and then the carrier concentration thereof is determined. The arbitrary spot may be one of the 10 to 50 spots subjected to the measurement carried out for determined the mean value. The Raman measurement is not particularly limited but may be carried out by, for example, irradiating the Group III nitride crystals with polarized light emitted from an argon ion laser with an emission wavelength of 488 nm, at room temperature. In this connection, for example, a double monochromator or photoelectric doubling tube can be used for the Raman measurement.

In the Group III nitride substrate of the present invention, it is preferable that the Group III nitride crystals are formed through liquid phase epitaxy. This is because the liquid phase epitaxy allows the Group III nitride crystals to grow at a higher growth rate.

In the Group III nitride substrate of the present invention, it is preferable that the plane sloped in one direction and the (0001) planes form an angle of 0.05° to 0.5° therebetween.

The semiconductor layer of the Group III nitride substrate is formed by, for example, vapor phase epitaxy. In this case, the semiconductor layer has a thickness of, for instance, about 100 μm, and the plane that is sloped and the (0001) planes form an angle of, for example, 0.5° therebetween in the Group III nitride substrate. However, it should be understood that when a thicker film is to be grown, the vapor phase epitaxy also allows the angle formed between the plane that is sloped and the (0001) planes to be 0.5° or larger.

In the Group III nitride substrate of the present invention, it is preferable that the surfaces of the Group III nitride crystals and the (0001) planes form an angle of 0.05° to 5° therebetween.

The Group III nitride crystals of the Group III nitride substrate are formed by, for example, liquid phase growth. In this case, the Group III nitride crystals grow, for instance, up to about 2 to 3 mm. In this Group III nitride substrate, the surfaces of the Group III nitride crystals and the (0001) planes form an angle of, for example, 5° therebetween. In this connection, it should be understood that in the case of growing crystals having a thickness of 3 mm or thicker, the angle formed between the surfaces of the Group III nitride crystals and the (0001) planes can be set at 0.5° or larger.

In the present invention, a surface of a Group III nitride substrate is sloped by at least 0.05° with respect to a C-plane, where the C-plane is a plane perpendicular to a C-axis of the Group III nitride substrate. In the following, providing this slope sometimes is referred to as offcutting. In other words, offcutting is to process the surface of the Group III nitride substrate so as to form an angle sloped by at least 0.05° from the C-plane, which is a plane perpendicular to the C-axis of the Group III nitride substrate.

In the Group III nitride substrate of the present invention, it is preferable that the Group III nitride crystals are gallium nitride crystals.

In the manufacturing method of the present invention, it is preferable that the at least one Group III element is gallium and the Group III nitride crystals are gallium nitride.

In the manufacturing method of the present invention, the Group III nitride crystals are grown on the semiconductor layer preferably at a growth rate of at least 20 μm/hr, and more preferably at 30 μm/hr to 50 μm/hr.

In the manufacturing method of the present invention, the Group III nitride crystals that have grown on the semiconductor layer have variations in in-plane carrier concentration that are preferably within a range of one fifth to five times a carrier concentration mean value, more preferably one third to three times, and further preferably half to twice.

In the manufacturing method of the present invention, it is preferable that the atmosphere containing nitrogen is a pressure atmosphere. The pressure of the pressure atmosphere is, for example, in a range of 2 to 100 atm and preferably 5 to 50 atm.

In the manufacturing method of the present invention, it is preferable that the solvent is alkali metal. It also is preferable that the solvent contains alkaline-earth metal beside the alkali metal. Preferably, the alkali metal is at least one selected from a group consisting of sodium, lithium, and potassium. Furthermore, calcium is preferable as the alkaline-earth metal.

In the manufacturing method of the present invention, the method of processing the semiconductor layer substrate in the step (ii) is not particularly limited but is preferably polishing.

In the manufacturing method of the present invention, it is preferable that the steps (i) and (ii) are carried out simultaneously. In this case, preferably the steps (i) and (ii) are carried out using a temperature gradient provided during crystal growth.

In the manufacturing method of the present invention, the substrate is not particularly limited but preferably is made of sapphire.

Hereinafter, one example of the present invention is described. The method of the present invention is a method of manufacturing a substrate including Group III nitride crystals expressed by a composition formula of $Al_xGa_yIn_{1-x-y}N$ (wherein $0 \leq x \leq 1$ and $0 \leq y \leq 1$), such as GaN or AlGaN.

In this method, first, on a substrate is formed a semiconductor layer that is formed of a semiconductor expressed by a composition formula of $Al_uGa_vIn_{1-u-v}N$ (wherein $0 \leq u \leq 1$ and $0 \leq v \leq 1$) and has a (0001) plane present at its surface (Step (i)). Examples of the substrate to be used include a sapphire substrate whose surface is a C-plane, a C-plane SiC substrate, a (111) plane GaAs or Si substrate, and a GaN substrate obtained by growing a thin film thereon. Furthermore, a substrate with a structure such as an ELOG structure also may be used as the substrate. The semiconductor layer is a crystal layer to serve as a seed crystal, and specifically, is formed of GaN or $Al_uGa_{1-u}N$. Such a semiconductor layer can be formed by, for instance, a metal organic chemical vapor deposition (MOCVD) method, a molecular beam epitaxy (MBE) method, or a hydride vapor phase epitaxy (HVPE) method. In the above-mentioned method, the surface of the semiconductor layer to be formed is a (0001) plane. This semiconductor layer serves as a seed crystal to be used in the crystal growth step carried out later.

Next, the surface of the semiconductor layer is processed so as to become a plane sloped with respect to the (0001) plane of the semiconductor layer to serve as a seed crystal (Step (ii)). The processing can be carried out by, for example, polishing. Specifically, the processing can be carried out by, for example, mechanochemical polishing using an abrasive liquid containing diamond as an abrasive. By such processing, the surface of the semiconductor layer becomes a plane sloped with respect to the (0001) plane macroscopically (on the order of millimeters). Microscopically (at an atomic level), however, this surface is a stepped surface with the (0001) plane being exposed as shown in the enlarged view in FIG. 2. Preferably, the surface observed macroscopically (on the order of millimeters) and the (0001) plane form an angle of 0.05° to 0.5° therebetween.

Next, in an atmosphere containing nitrogen (preferably, a pressure atmosphere having a pressure of 100 atm or lower), the surface of the semiconductor layer is brought into contact with a melt containing a solvent and at least one Group III element selected from gallium, aluminum, and indium and thereby the at least one Group III element and the nitrogen are made to react with each other to grow Group III nitride crystals on the semiconductor layer (Step (iii)). As the atmosphere containing nitrogen there is used a nitrogen gas atmosphere, or an atmosphere of a mixed gas of nitrogen gas and ammonia. The atmosphere has a pressure of, for instance, 1 atm to 50 atm.

As the solvent can be used, for example, a flux of an alkali metal. As the alkali metal is used at least one selected from lithium, sodium, and potassium, i.e. one of them or a mixture thereof. The solvent may contain alkaline-earth metal such as Ca beside the alkali metal.

The Group III element to be used as a material is selected depending on the type of crystals to be formed. This step (iii) makes it possible to form Group III nitride crystals expressed by a composition formula of $Al_xGa_yIn_{1-x-y}N$ (wherein $0 \leq x \leq 1$ and $0 \leq y \leq 1$), such as GaN or $Al_xGa_{1-x}N$, by a liquid phase epitaxy method. Furthermore, after the Group III nitride crystals are grown, a part other than the Group III nitride crystals is removed by polishing or the like as required and thereby a substrate formed of Group III nitride crystals alone can be obtained.

In the method of the present invention, the surface of the seed crystal layer is processed into a stepped shape with the (0001) plane being exposed. Consequently, abnormal growth can be prevented from occurring during crystal growth. Furthermore, as compared to the case of using a common seed crystal substrate, crystals with higher surface flatness can be obtained.

Particularly, in the liquid phase epitaxy, the use of a substrate sloped in one direction makes it possible to improve the growth rate and uniformity in concentration of impurities introduced into the crystals as compared to the case of using a substrate that is not sloped.

The Group III nitride substrate of the present invention is a substrate obtained by the above-mentioned manufacturing method. That is, it includes: a substrate; a semiconductor layer formed on the substrate; and Group III nitride crystals formed on the semiconductor layer, wherein the semiconductor layer is formed of a semiconductor expressed by a composition formula of $Al_uGa_vIn_{1-u-v}N$ (wherein $0 \leq u \leq 1$ and $0 \leq v \leq 1$), a surface of the semiconductor layer that is in contact with the Group III nitride crystals is a plane that is sloped in one direction and including steps of (0001) planes arranged step-wise. In this substrate, the Group III nitride crystals are, for example, gallium nitride.

Hereinafter, the present invention is described further in detail using practicable examples. The following examples are described with respect to the case of growing GaN crystals as an example. However, Group III nitride crystals expressed by a composition formula of $Al_xGa_yIn_{1-x-y}N$ (wherein $0 \leq x \leq 1$ and $0 \leq y \leq 1$) such as $Al_xGa_{1-x}N$ or AlN also can be formed by the similar method.

EXAMPLE 1

In this example, the description is directed to a method including depositing GaN crystals on a sapphire substrate by a metal organic chemical vapor deposition (MOCVD) method, which then is used as a seed crystal substrate, and growing single crystals by a liquid phase epitaxy (LEP) method using the seed crystal substrate. The present invention is characterized in that the surfaces of GaN crystals formed by deposition are processed to be sloped.

Figure 2:
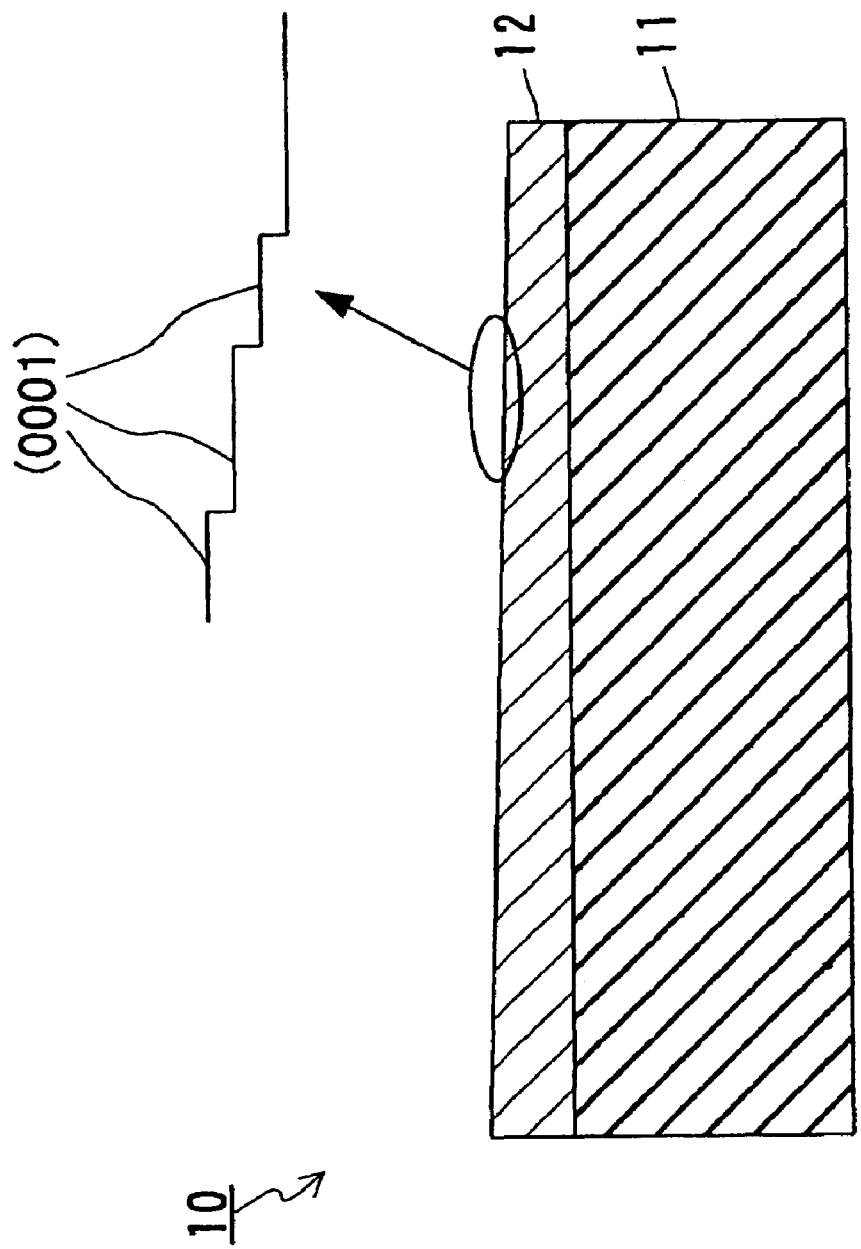
FIG. 2 includes a cross-sectional view showing another example of a manufacturing method according to the present invention and an enlarged schematic view showing a surface structure obtained by the method.

First, the seed crystal substrate is formed. FIG. 2 shows a configuration of this substrate. A substrate 10 includes a sapphire substrate 11 made of sapphire (crystalline $Al_2O_3$) and a seed layer 12 made of GaN. In this connection, the seed layer 12 may contain aluminum or indium instead of gallium as a Group III element. In other words, the seed layer 12 is not limited as long as it is formed of Group III nitride that satisfies a composition formula of $Al_uGa_vIn_{1-u-v}N$ (wherein $0 \leq u \leq 1$ and $0 \leq v \leq 1$). The surface of the seed layer 12 is a plane sloped from a (0001) plane.

Figure 3A:
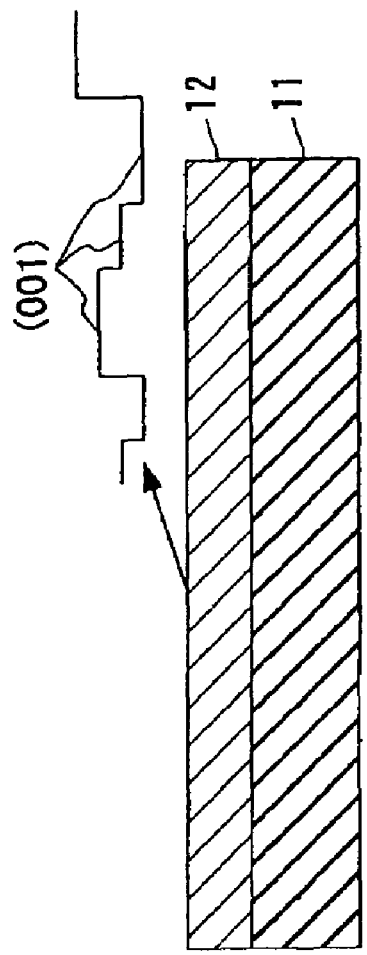
FIGS. 3A to 3C are cross-sectional views illustrating steps of still another example of a manufacturing method according to the present invention.

A method of manufacturing the substrate 10 is described with reference to FIGS. 3A to 3C. First, the temperature of the sapphire substrate 11 is raised to be about 1020° C. to 1100° C., and then the seed layer 12 is formed by the MOCVD method (FIG. 3A). Specifically, trimethylgallium (TMG) and ammonia ($NH_3$) are supplied onto the substrate to form the seed layer 12 of GaN. In this connection, another method that allows a Group III nitride semiconductor to grow, such as, for instance, a hydride vapor phase epitaxy (HVPE) method or a molecular beam epitaxy (MBE) method, may be used.

The seed layer 12 has a thickness of, for example, 20 μm. Microscopically, the surface of the seed layer 12 includes concavities and convexities formed of steps as shown in the enlarged view in FIG. 3A.

Figure 3B:
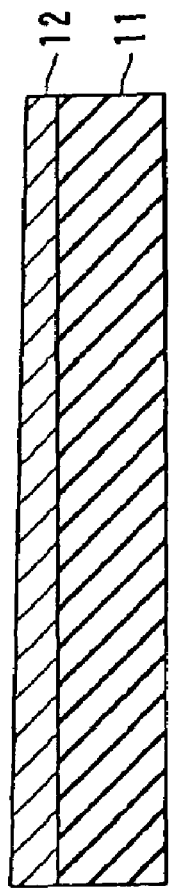

Next, in order to bring the crystal orientation at the surface of the GaN crystals (the seed layer 12) obtained in the above to be offcut, the surface of the seed layer 12 is ground to be sloped (FIG. 3B). In the present example, mechanochemical polishing is carried out using an abrasive liquid containing diamond as an abrasive so that the surface is sloped away from the (0001) plane by 0.1 degree. The offcut angle may be set depending on the thickness of the GaN film or the crystallinity of a thin film of crystals to be grown later but is desirably around 0.05° to 0.5°. Microscopically, the surface of the seed layer 12 of the substrate shown in FIG. 3B has a stepped shape as shown in FIG. 2. The size of the enlarge view in FIG. 2 is about 0.5 to 5 nm in length and about 1 to 5 μm in width.

Figure 3C:
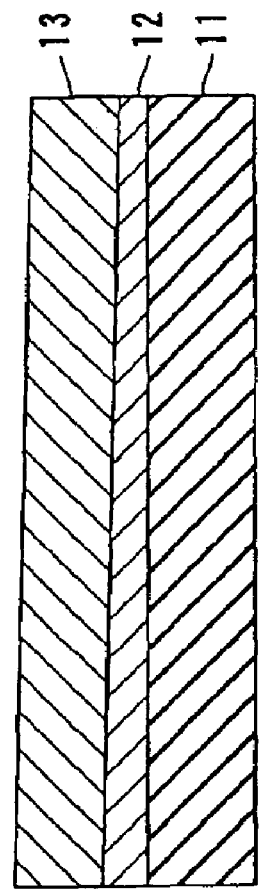

Using the seed crystal substrate thus obtained, GaN single crystals 13 are grown as shown in FIG. 3C. A method for growing them is described below.

Figure 4:
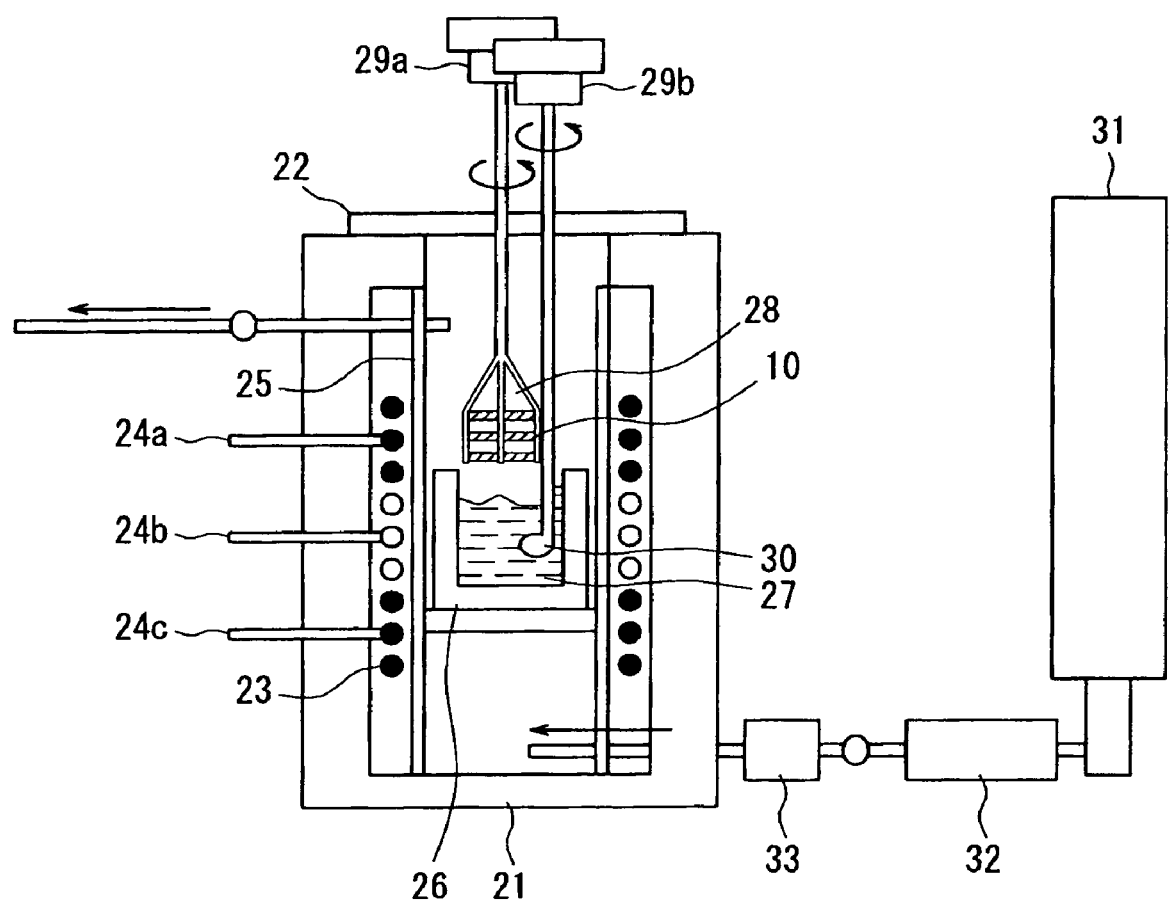
FIG. 4 is a schematic view showing an example of a manufacturing apparatus used in the manufacturing method of the present invention.

FIG. 4 shows an example of an LPE apparatus (an electric furnace) used in the method of the present invention. This LPE apparatus includes a chamber 21 made of stainless steel and a furnace cover 22. The LPE apparatus is constructed to bear a pressure of 50 atm. Heaters 23 are disposed inside the chamber 21. The chamber 21 is composed of three zones provided with thermocouples 24a to 24c, respectively. The three zones are controlled so as to keep their temperature within a range of ±0.1° C., and thereby the temperature inside the furnace is controlled to be uniform. A core tube 25 is disposed to improve the uniformity of the temperature inside the furnace and to prevent impurities from being introduced from the heaters 23.

A crucible 26 made of boron nitride (BN) is disposed inside the core tube 25. A material is placed inside the crucible 26 and the temperature of the crucible is raised to prepare a melt 27. A substrate 10 to serve as a seed crystal is attached to a substrate holding member 28. In the apparatus shown in FIG. 4, a plurality of substrates 10 can be attached to the substrate holding member 28. The substrate 10 is rotated by a rotary motor 29a. A stirring propeller 30 can be immersed in the melt 27. The propeller 30 is rotated by a rotary motor 29b. In the present example, a common rotary motor can be used since the atmosphere pressure is 10 atm or lower. However, an electromagnetic induction rotary mechanism is used under an atmosphere pressure exceeding 10 atm. Atmosphere gas (raw material gas) is supplied from a gas source 31. The pressure of the atmosphere gas is adjusted by a pressure regulator 32. The atmosphere gas is fed into the furnace after impurities are removed therefrom by a gas purification unit 33.

The following description is directed to a method of growing GaN crystals.

(1) Predetermined amounts of Ga and Na to serve as a flux are weighed and then are placed inside a crucible. The Ga used may have a purity of 99.9999% (six nine). The Na may be purified Na. Na can be purified as follows: Na is heated to melt in a glove box, the inside of which has been subjected to He substitution. Then for example, oxides emerging on the surface layer are removed. Alternatively, Na may be purified by zone refining. The purity of Na can be increased by melting and solidifying Na repeatedly in a tube to allow impurities to deposit and then removing them. An offcut seed crystal substrate is attached to the substrate holding member.

(2) In order to melt the raw material placed inside the crucible, the temperature inside the electric furnace is raised to 900° C. and thereby a melt of the raw material is prepared. At this stage, the seed crystal substrate is not placed inside the crucible. In order to mix Ga and Na, the melt is stirred for several hours with the propeller being immersed in the melt. The atmosphere gas is, for instance, nitrogen gas or gas containing ammonia. The pressure of the nitrogen gas is set at about 1 atm to prevent Ga and Na from reacting with nitrogen gas at this stage. When ammonia is contained, the reaction occurs at lower pressure. Hence, it is preferable that the nitrogen gas alone is used for the atmosphere gas at this stage.

(3) Next, the temperature of the crucible is set at 800° C. to bring the melt into a supersaturation state. In addition, the atmosphere pressure is increased. In the present example, the atmosphere is, for example, nitrogen gas alone and is set at 50 atm. Subsequently, the seed crystal substrate is lowered to a position just above the surface of the melt and its temperature is made to approach the temperature of the melt. After several minutes, the seed crystal substrate is put into the melt to allow GaN crystals to start growing.

(4) During the crystal growth, the substrate is rotated at a rotational speed in a range of 10 rpm to 200 rpm. Desirably, the substrate is rotated at around 100 rpm. After the crystals are grown for 24 hours, the substrate is lifted to a position that is away from the surface of the melt by 5 to 10 mm. After being lifted, the substrate is rotated at a rotational speed of 300 rpm to 1500 rpm (desirably, around 1000 rpm) in order to remove the melt remaining on the substrate surface. Thereafter, the substrate including GaN single crystals thus grown is taken out of the chamber. During the crystal growth, the temperature of the crucible may be kept constant. However, the temperature of the melt may be lowered at a constant rate to keep the supersaturation of the melt constant.

In the present invention, an offcut substrate was used as a seed crystal. Hence, abnormal growth can be prevented from occurring during the crystal growth. Furthermore, a substrate with higher surface flatness can be obtained as compared to the case of using a common seed crystal substrate. Generally, steps (steps composed of concavities and convexities) oriented at random are present at the surface of GaN deposited as in the above. Consequently, crystal growth proceeds from respective portions of the steps at random and thereby raised parts like hillocks and facets appear at the surface. As a result, abnormal crystal growth (hillock or island growth) occurs. In the present example, the use of the offcut substrate shown in FIG. 2 allows the direction and density of the steps to be controlled to achieve stable two-dimensional crystal growth.

Figure 1B:
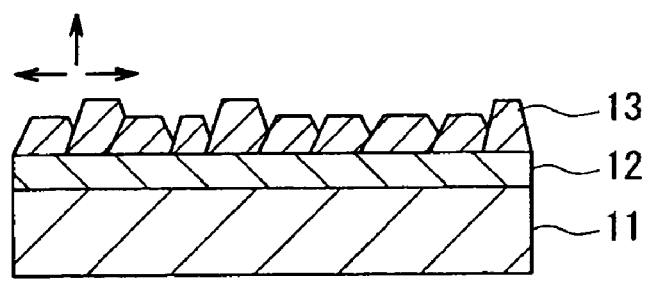
FIGS. 1C and 1D show crystal growth according to an example of a manufacturing method according to the present invention.
Figure 1C:
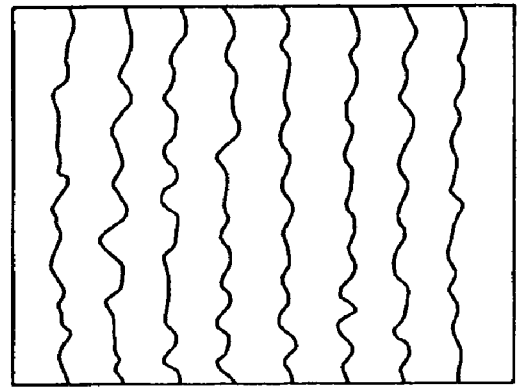
Figure 1D:
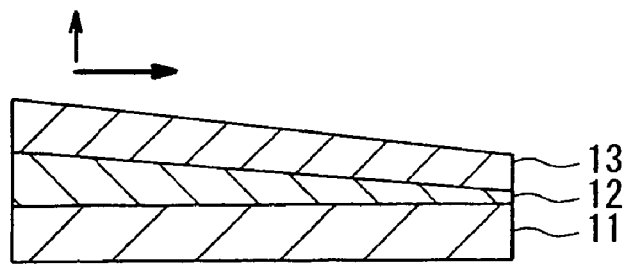

FIGS. 1A and 1B show typical surface morphological shapes obtained in the case where LPE growth actually is carried out on a substrate having no slope with respect to its C-plane while FIGS. 1C and 1D show those obtained in the case where crystal growth is carried out on an offcut substrate. The use of a seed crystal layer that is parallel to the C-axis results in hexagonal island growth (three-dimensional growth) (FIGS. 1A(surface) and 1B(cross section). On the other hand, when using a seed crystal layer offcut from the C-axis, crystals can grow that have a stepped surface and a surface morphology in which macroscopically the entire surface is lustrous (FIGS. 1C(surface) and 1D(cross section)).

In addition, as shown in FIGS. 1A and 1B, in the crystals formed through the island growth, carrier concentrations vary in a crystal plane considerably, for instance, by about two orders of magnitude with respect to a desired carrier concentration. This is because, in the case of the island growth, crystals grow on not only C-planes but also side faces thereof (lateral growth). Hence, conceivably, the variations are caused because the planes other than the C-planes have higher coefficients of impurity incorporation. Furthermore, it also is conceivable that the variations are caused because the surface is provided with very large concavities and convexities due to the development of large hexagonal islands and thereby great variations in the state of diffusion of the impurities contained in the solution occur at the solid-liquid interface. The sizes of the hexagonal islands are about 1 to 5 μm.

On the other hand, when using an offcut substrate (FIGS. 1C and 1D), it was possible to limit the variations in in-plane carrier concentration within one order of magnitude with respect to the desired value, i.e. within a range of one fifth to five times the desired value. Accordingly, the variations in in-plane carrier concentration were reduced considerably by using an offcut substrate particularly when crystals are grown from the liquid phase. Conceivably, this is caused as follows. The use of the offcut substrate makes the lateral growth dominate and thereby the growth faces are specified, which mainly results in a relatively constant amount of impurities to be incorporated. Furthermore, since the surface is relatively flat, considerably large concave portions are not produced. Consequently, variations in the state of diffusion of the impurities contained in the solution are not caused at the solid-fluid interface.

Furthermore, it was confirmed that the growth rate improved by about 10% to 100% when using the offcut substrate. Conceivably, this is because when Group III nitride crystals are grown by the LPE method, the lateral growth dominates (indicated with an arrow in FIG. 1D) although it depends on the growth condition, and further the use of the offcut substrate allows this effect to manifest itself more noticeably.

Figure 5A:
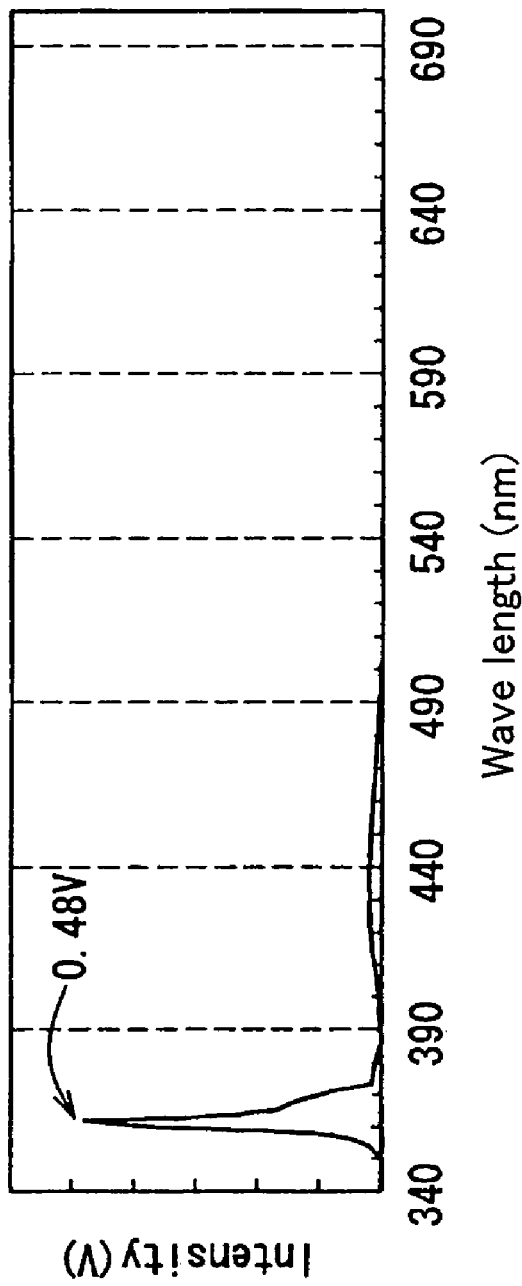
FIG. 5A is a graph showing PL intensity of a GaN crystal obtained by a conventional method.
Figure 5B:
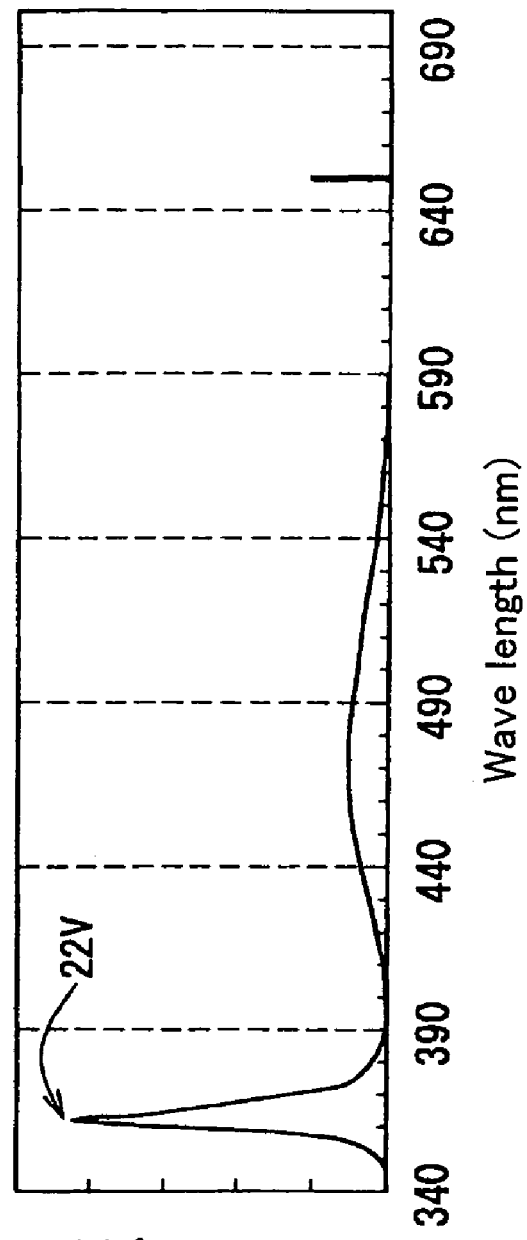
FIG. 5B is a graph showing PL intensity of a GaN crystal obtained by a still another example of the present invention.
Figure 6A:
FIGS. 6A to 6F are cross-sectional views showing steps of a further example of a manufacturing method according to the present invention.
Figure 6B:
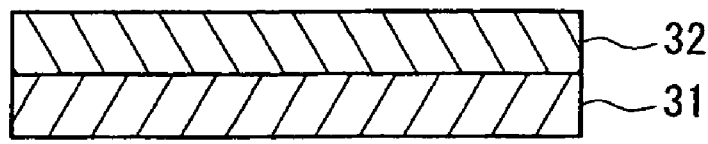
Figure 6C:
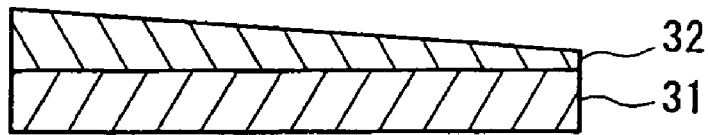
Figure 6D:
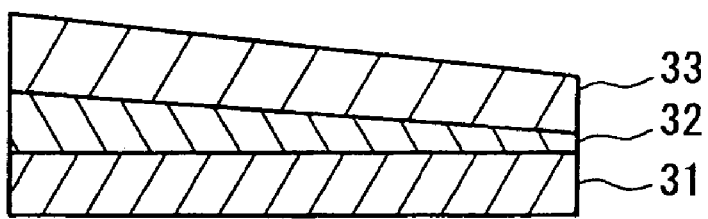
Figure 6E:
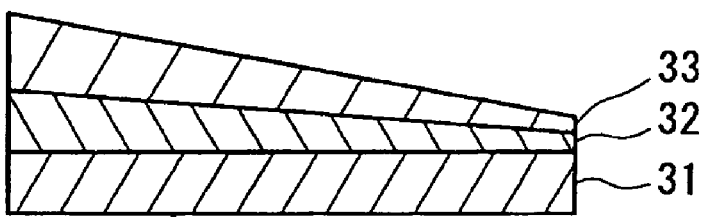
Figure 6F:
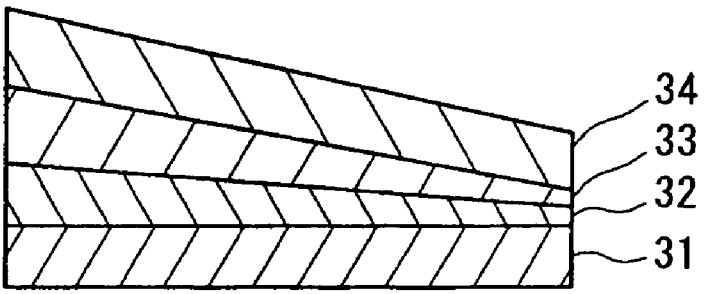

GaN crystals were produced by the method described above and then were subjected to measurements of dislocation density and PL intensity. They had a dislocation density of $1 \times 10^2$ cm$^{-2}$ or lower. The spectrum of the PL intensity is shown in FIG. 5B. The intensity obtained at the peak around 360 nm of the spectrum shown in FIG. 5B was 22 V. FIG. 5A shows the PL intensity of a GaN thin film produced by a general MOCVD method for comparison. In this connection, FIGS. 5A and 5B show spectrums measured with slits having different widths from each other, respectively. The peak intensity obtained around 360 nm of the spectrum shown in FIG. 5A was 0.48 V. The crystals obtained by the method of the present invention had a PL intensity that was about fifty times higher than that of the crystals produced by a conventional method.

The growth of a GaN thick film carried out by a general HVPE method is conducted at a high temperature, specifically at 1050° C. In the present invention, since crystal growth can be carried out at a low temperature, specifically at 800° C., the warping of a wafer caused by a difference in coefficient of linear expansion between the sapphire substrate and the crystals grown thereon can be reduced.

The present example used a flux containing Na alone. However, similar effects can be obtained even when using a mixed flux containing alkaline-earth metal such as, for example, Ca and a Li, Na, or K flux. For instance, when using a mixed flux containing Na and Ca, the Ca mixed to account for about 10% of the whole allows crystals to grow at lower pressure.

In the present example, the description was directed to the manufacture of a GaN single crystal substrate using gallium. However, it is desirable to manufacture a substrate having low absorptivity with respect to a wavelength used in an optical device to be formed on the substrate. Hence, it is preferable that in a substrate for a light emitting diode or a semiconductor laser handling light within the ultraviolet region there are formed $Al_xGa_{1-x}N$ (wherein $0 \leq x \leq 1$) single crystals that contain a large amount of Al and have low absorptivity with respect to light with short wavelengths. In the present invention, it also is possible to substitute a part of Ga by another Group III element to form such Group III nitride semiconductor single crystals.

The best effect of the present invention is that abnormal growth is inhibited and thereby a Group III nitride semiconductor single crystal substrate having low dislocation density and a flat surface can be obtained by a highly mass-produced method. Particularly, in the LPE growth, hexagonal island growth is prevented from occurring, which makes it possible to improve the uniformity of the in-plane carrier concentration and the growth rate. That is, according to the present invention, a substrate that allows a highly-reliable device to be manufactured can be provided at low cost. Particularly, the flat substrate with a low dislocation density can facilitate the process of manufacturing a device such as a semiconductor laser through homoepitaxial growth and allows a device to be manufactured with a high yield.

EXAMPLE 2

Group III nitride substrates with four different off angles were obtained in the same manner as in Example 1 expect that crystals were grown using seed substrates whose offcut angles were 0.05°, 0.1°, 0.3°, and 0.5°, respectively.

COMPARATIVE EXAMPLE 1

Group III nitride substrates with two different offcut angles were obtained in the same manner as in Example 1 expect that crystals were grown using seed substrates whose offcut angles were 0.0°, and 0.03°, respectively.

With respect to the Group III nitride substrates thus obtained according to Example 2 and Comparative Example 1, the relationship between the offcut angle of the seed substrate and the growth rate as well as variations in in-plane carrier concentration was examined. Table 1 shows the results. The carrier concentration was measured by the aforementioned method. This also applies to the examples described below.

As shown in Table 1, when the offcut angle was 0.05° or larger, an increase in growth rate of about 10% was observed and the variations in carrier concentration were reduced.

Furthermore, when the offcut angle was about 0.5°, the growth rate was higher than twice that of just the substrate, and the variations in carrier concentration were within one order of magnitude with respect to a carrier concentration mean value (i.e. one fifth to five times the mean value) (in this case, $5 \times 10^{17}$).

On the other hand, when the offcut angle was about 0.03°, no difference was found as compared to the just substrate (whose offcut angle was 0.0°).

The improvement in growth rate is particularly effective for the reduction in growth time in the case of using a thick film as a substrate employed for producing a device. In addition, the improvement in uniformity of in-plane carrier concentration is important particularly for the uniformity of device characteristics.

TABLE 1

| | Offcut Angle | Growth Rate (μm/hr) | Variations in in-plane carrier concentration of wafer |
|---|---|---|---|
| Example 2 | 0.05 | 20 | 1/5 - Mean Value - 5 times |
| | 0.1 | 25 | 1/5 - Mean Value - 5 times |
| | 0.3 | 35 | 1/3 - Mean Value - 3 times |
| | 0.5 | 40 | 1/3 - Mean Value - 3 times |
| Comparative Example 1 | 0.0 | 18 | 1/10 - Mean Value - 10 times |
| | 0.03 | 18 | 1/10 - Mean Value - 10 times |

EXAMPLE 3

An example of the present invention in which the offcut angle further is increased is described with reference to FIGS. 6A to 6F. In this example, a C-plane sapphire substrate 31 was used as a substrate. GaN 32 was grown on the sapphire substrate 31 by the MOCVD method to have a thickness of 30 μm. Next, the GaN 32 was subjected to the mechanochemical polishing to have an offcut angle of 0.5°. At this stage, the substrate had a size of 20 mm×20 mm. Subsequently, using a Na flux as in Example 1, GaN 33 was grown on the substrate for 95 hours to have a thickness of 1.9 mm (at a growth rate of 20 μm/hr). Further, polishing was carried out for a second time to obtain an offcut angle of 5°. On the above-mentioned substrate with an offcut angle of 5° there further was grown GaN 34 by LPE to have a thickness of 100 μm (for about 2.5 hours at a growth rate of 40 μm/hr). Thus, crystals were obtained that have high flatness and a surface at which hexagonal facets hardly were found after the completion of the LPE due to the effect of the offcut angle. Finally, the crystal surface was subjected to the mechanochemical polishing and thus a final Group III nitride substrate was obtained. In this case, an excellent Group III nitride substrate was obtained in which the variations in carrier concentration were within a range of one third to three times a carrier concentration mean value of $1 \times 10^{18}$.

In this case, the Group III nitride substrate was completed with the sapphire substrate included therein. However, it also was possible to remove the sapphire substrate 31 by polishing to provide a self-supported substrate as required.

EXAMPLE 4

In this example, the description is directed to the case where an offcut substrate is produced using a temperature gradient or concentration gradient with reference to FIGS. 7A to 7D and FIG. 8.

A substrate 31 and the method of producing a substrate 32 shown in FIGS. 7A to 7D are identical to those used in Example 3.

Figure 8:
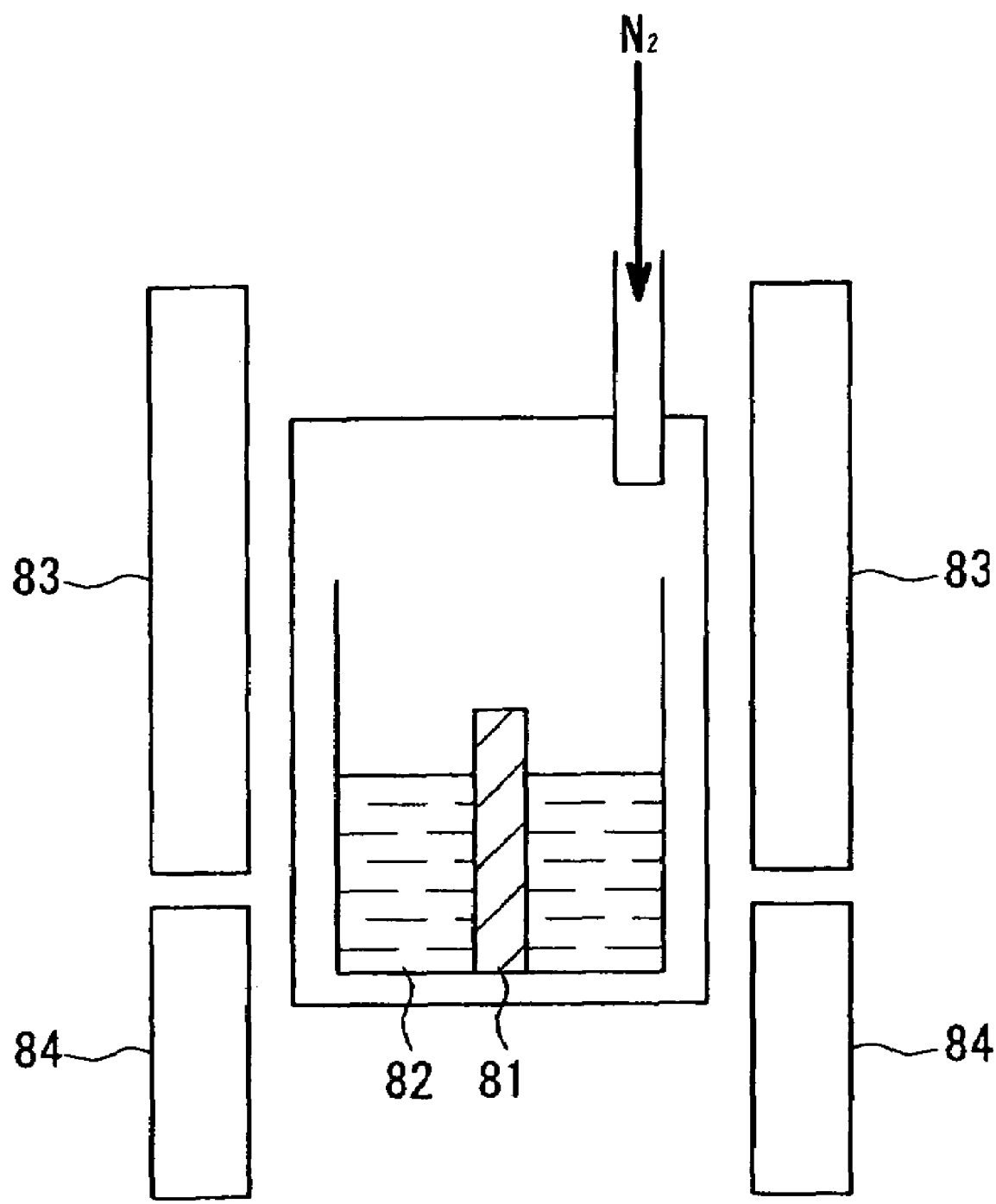
FIG. 8 is a schematic view showing another example of a manufacturing apparatus used in a manufacturing method of the present invention.

Using a growth furnace installed in an electric furnace having two zones like the one shown in FIG. 8, the LPE growth was carried out with temperature gradient being provided inside the electric furnace. In FIG. 8, numeral 81 indicates a substrate, numeral 82 a solution, numeral 83 an upper heater, and numeral 84 a lower heater.

Figure 7A:
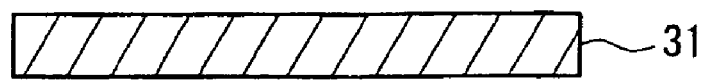
FIGS. 7A to 7D are cross-sectional views showing steps of yet another example of a manufacturing method according to the present invention.
Figure 7B:
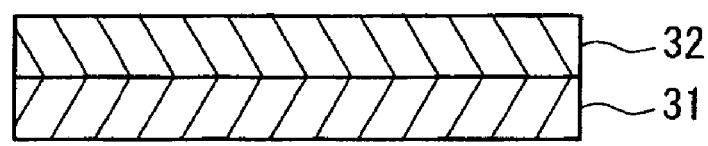
Figure 7C:
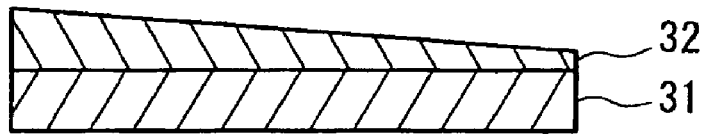
Figure 7D:
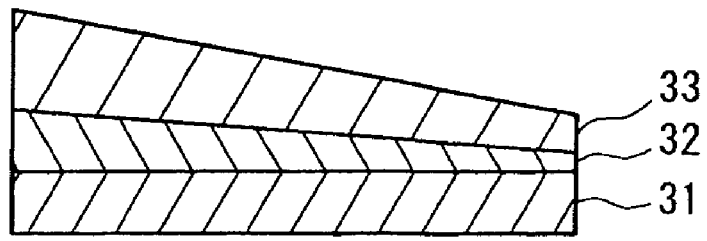

A sample with a shape shown in FIG. 7C was placed in a crucible as shown in FIG. 8 and thereby a GaN thick film 33 was grown.

After a growth time of 100 hours, crystals were obtained that had an offcut angle of 2° and a thickness of about 2 mm. In this case, the crystals thus obtained had lustrous and excellent surface morphology and thus relatively favorable crystals were obtained in which hexagonal island growth hardly was caused. The surface of the crystals thus obtained was subjected to the mechanochemical polishing and then variations in in-plane carrier concentration were determined. As a result, the variations were within one order of magnitude of the in-plane carrier concentration mean value.

EXAMPLE 5

Figure 9:
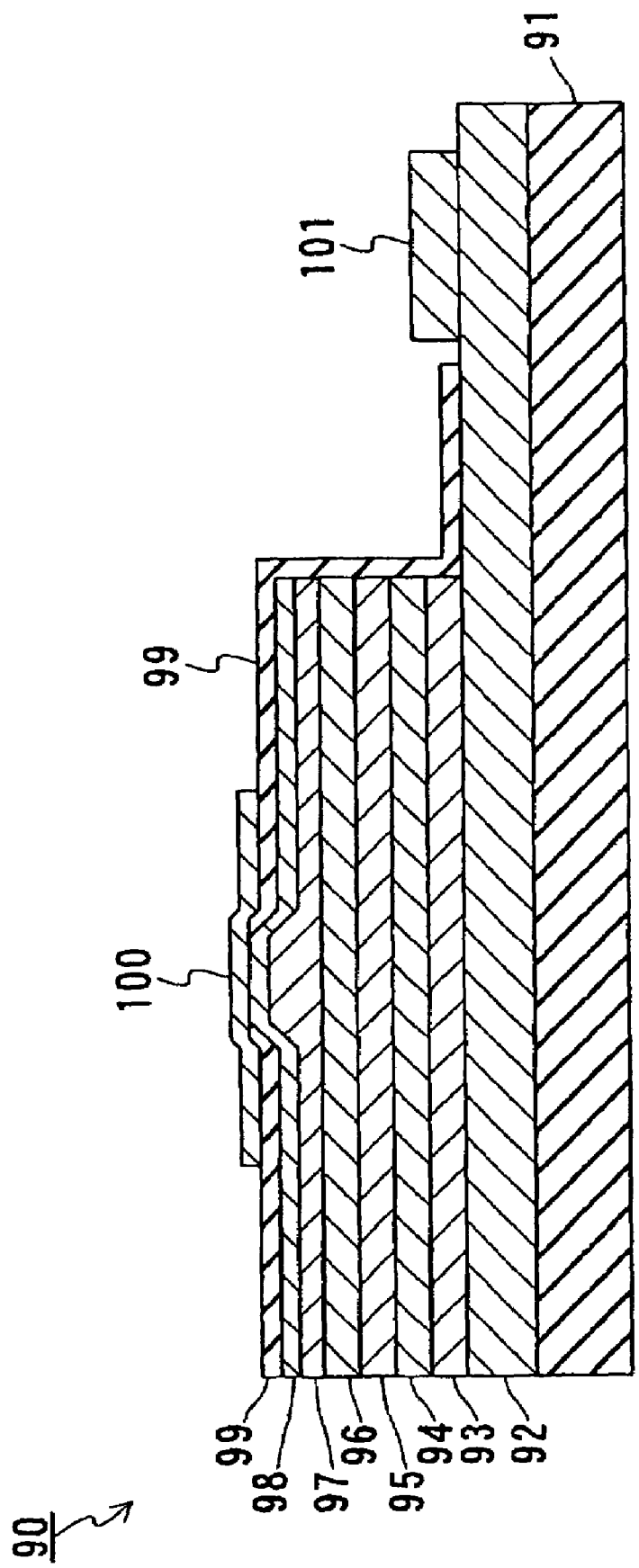
FIG. 9 is a cross-sectional view showing an example of a semiconductor device according to the present invention.

In Example 5, the description is directed to an example of a method of manufacturing a semiconductor laser using a substrate obtained in Example 1. FIG. 9 shows the configuration of a semiconductor laser 90.

First, on a substrate 91 obtained in the above-mentioned example is formed a contact layer 92 of n-type GaN doped with Si so as to have a carrier concentration of $5 \times 10^{18}$ or lower. The self-supported substrate 91 is a subatrate obtained in Example 1 by removing a sapphire substrate on a back surface from an offcut substrate on which Group III nitride crystals are formed and polishing the back surface so as to be parallel to a front surface. Incidentally, it is not always necessary to remove the sapphire substrate on the back surface. In GaN-based crystals (crystals containing Ga and N), when Si is added thereto as an impurity, holes present in Ga increase in number. Since the holes present in Ga diffuse easily, they have harmful effects in terms of, for example, lifetime when a device is formed on the contact layer. Hence, the doping amount is controlled so that the contact layer has a carrier concentration of $3 \times 10^{18}$ or lower.

Next, on the contact layer 92 are formed a cladding layer 93 of n-type $Al_{0.07}Ga_{0.93}N$ and a light guiding layer 94 of n-type GaN. Subsequently, as an active layer 95 there is formed a multiple quantum well (MQW) composed of a well layer (with a thickness of about 3 nm) made of $Ga_{0.8}In_{0.2}N$ and a barrier layer (with a thickness of about 6 nm) made of GaN. Thereafter, on the active layer 95 are formed sequentially a light guiding layer 96 of p-type GaN, a cladding layer 97 of p-type $A_{0.07}Ga_{0.93}N$, and a contact layer 98 of p-type GaN. These layers can be formed by well-known methods. The semiconductor laser 90 is of a double-hetero junction type. The energy gap of the well layer containing indium in the MQW active layer is smaller than those of the n-type and p-type cladding layers containing aluminum. On the other hand, the highest optical refractive index is obtained in the well layer of the active layer 95, while the light guiding layers and the cladding layers have optical refractive indices that decrease in this order.

On the contact layer 98 there is formed an insulating film 99 forming a current injection region having a width of about 2 μm. A ridge part to serve as a current constriction part is formed in the upper portion of the p-type cladding layer 97 and the p-type contact layer 98.

On the upper side of the p-type contact layer 98 there is formed a p-side electrode 100 that is in ohmic contact with the contact layer 98. The p-side electrode 100 may be formed of a layered product of nickel (Ni) and gold (Au).

On the n-type contact layer 92 is formed an n-side electrode 101 that is in ohmic contact with the contact layer 92. The n-side electrode 101 may be formed of a layered product of titanium (Ti) and aluminum (Al).

The semiconductor laser produced by the method described above was subjected to a device evaluation. When a predetermined forward voltage was applied between the p-side electrode and the n-side electrode of the semiconductor laser obtained in the above, positive holes and electrons are injected into the MQW active layer from the P-side electrode and the n-side electrode, respectively, to be recombined with each other in the MQW active layer and thereby an optical gain was produced. Consequently, the semiconductor laser generated oscillation with an emission wavelength of 404 nm.

In the semiconductor laser of the present example, a substrate with a low dislocation density, specifically, $1\times10^2$ cm$^{-2}$ or lower, was used as its substrate. Accordingly, the semiconductor laser had a lower threshold, improved luminous efficiency, and improved reliability as compared to one produced on a GaN substrate with a high dislocation density.

Furthermore, it also is possible to produce a GaN substrate by removing the sapphire part other than the GaN crystals by, for instance, polishing, and then to produce a device thereon.

Using a substrate obtained by the manufacturing method of the present invention, Group III nitride crystals are grown epitaxially on the substrate, and thereby a semiconductor device is obtained that includes a semiconductor element such as a LD or LED.

As described above, according to the manufacturing method of the present invention, a substrate can be manufactured easily that includes Group III nitride crystals having excellent characteristics.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A Group III nitride substrate comprising:
a substrate;
a semiconductor layer formed on the substrate; and
Group III nitride crystals formed on the semiconductor layer,
wherein the semiconductor layer is formed of a semiconductor expressed by a composition formula of $Al_uGa_vIn_{1-u-v}N$ (wherein $0\leq u\leq 1$ and $0\leq v\leq 1$),
a surface of the semiconductor layer is a plane that is sloped in one direction and includes steps of (0001) planes arranged step-wise,
the plane that is sloped in one direction and the (0001) planes form an angle of at least 0.05° therebetween, and
the Group III nitride crystals formed on the semiconductor layer have variations in in-plane carrier concentration, the variations being within a range of one fifth to five times a carrier concentration mean value, and
the Group III nitride crystals have a dislocation density of $1\times10^2$ cm$^{-2}$ or lower.

2. The Group III nitride substrate according to claim 1, wherein the Group III nitride crystals are formed through liquid phase epitaxy.

3. The Group III nitride substrate according to claim 1, wherein the plane sloped in one direction and the (0001) planes form an angle of 0.05° to 0.5° therebetween.

4. The Group III nitride substrate according to claim 2, wherein surfaces of the Group III nitride crystals and the (0001) planes form an angle of 0.05° to 5° therebetween.

5. The Group III nitride substrate according to claim 1, wherein the Group III nitride crystals are gallium nitride.

6. A semiconductor device comprising:
a substrate according to claim 1; and
a semiconductor element formed on the substrate.

7. The semiconductor device according to claim 6, wherein the semiconductor element is a laser diode or a light emitting diode.

* * * * *